United States Patent
Boskovic

(10) Patent No.: US 7,386,410 B2
(45) Date of Patent: Jun. 10, 2008

(54) CLOSED LOOP CONTROLLED REFERENCE VOLTAGE CALIBRATION CIRCUIT AND METHOD

(75) Inventor: Boris Boskovic, Toronto (CA)

(73) Assignee: ATI Technologies Inc., Markham, Ontario (CA)

( * ) Notice: Subject to any disclaimer, the term of this patent is extended or adjusted under 35 U.S.C. 154(b) by 123 days.

(21) Appl. No.: 11/162,884

(22) Filed: Sep. 27, 2005

(65) Prior Publication Data

US 2007/0073506 A1 Mar. 29, 2007

(51) Int. Cl.
*G01R 35/00* (2006.01)
(52) U.S. Cl. .................................... 702/107
(58) Field of Classification Search ................. 702/107
See application file for complete search history.

(56) References Cited

U.S. PATENT DOCUMENTS 6,515,917 B2 * 2/2003 Lamb et al. ........... 365/189.09

2006/0038577 A1 * 2/2006 Jang ........................... 324/763

OTHER PUBLICATIONS

JEDEC Solid State Technology Association; JEDEC Standard DDR2 SDRAM Specification; Jan. 2004; pp. 1-74.

* cited by examiner

*Primary Examiner*—John Barlow
*Assistant Examiner*—Stephen J Cherry
(74) *Attorney, Agent, or Firm*—Vedder Price P.C.

(57) ABSTRACT

A variable reference voltage circuit controllable in closed loop, for calibrating off-chip and on-chip drivers, margining and optimizing a reference voltage, for interfaces such as DDR2 or any other suitable interface. In one example, the on-chip variable reference voltage circuit, coupled to external fixed reference voltage, includes control logic and an array of switchable resistor elements (pull-up and pull-down resistors) that may each be selectively switched in or out of the circuit to change the reference voltage being supplied to an on-chip receiver.

6 Claims, 8 Drawing Sheets

| INTERNAL VREF RESISTOR CONFIGURATION FOR VREF ADJUSTMENT | | | | | |
|---|---|---|---|---|---|
| CFG | RUP2 | RUP1 | RDN2 | RDN1 | VREF |
| 1 | - | - | - | - | 50 % |
| 2 | - | - | - | RVREF | 33 % |
| 3 | - | - | 1/2RVREF | - | 25 % |
| 4 | - | - | 1/2RVREF | RVREF | 20 % |
| 5 | - | RVREF | - | - | 67 % |
| 6 | - | RVREF | - | RVREF | 50 % |
| 7 | - | RVREF | 1/2RVREF | - | 43 % |
| 8 | - | RVREF | 1/2RVREF | RVREF | 38 % |
| 9 | 1/2RVREF | - | - | - | 75 % |
| 10 | 1/2RVREF | - | - | RVREF | 57 % |
| 11 | 1/2RVREF | - | 1/2RVREF | - | 50 % |
| 12 | 1/2RVREF | - | 1/2RVREF | RVREF | 44 % |
| 13 | 1/2RVREF | RVREF | - | - | 80 % |
| 14 | 1/2RVREF | RVREF | - | RVREF | 62 % |
| 15 | 1/2RVREF | RVREF | 1/2RVREF | - | 56 % |
| 16 | 1/2RVREF | RVREF | 1/2RVREF | RVREF | 50 % |

FIG. 3

CLOSED LOOP CONTROLLED REFERENCE VOLTAGE CALIBRATION CIRCUIT AND METHOD

FIELD OF THE INVENTION

The invention relates generally to high-speed electrical interface optimization by controlling a closed loop reference voltage of differential receiver to calibrate off-chip and on-chip driver strength (impedance), and margin and optimize a reference voltage for reliable data transfer.

BACKGROUND OF THE INVENTION

High-speed interfaces and associated transmitters and corresponding differential receivers suitable for high-speed data transfers are known. High speed requires precisely adjusted transmitters and receivers to provide reliable data transfer. To increase data transfer rates and run interfaces at higher speeds, it becomes more difficult to provide a clean signal and as such the driver strength needs to be controlled to improve signal to noise levels and signal integrity. For example, a double data rate (DDR2) memory interface has a type of Off-Chip Driver calibration mechanism (OCD—Off-Chip Driver calibration) to allow for a transmitter on the memory side to be calibrated and programmed to a suitable strength level, by a memory controller connected on the other side of interface.

FIG. 1 shows conventional DDR2 memory interface. In this example, DDR memory 10, an integrated circuit chip, communicates with a memory controller of another integrated circuit chip 12 via bi-directional data bus 14 and unidirectional command bus 40. Each end of the data bus 14 includes programmable strength transmitters 16 and 18, differential receivers 20 and 22, and programmable termination resistor arrays 24 and 26, as part of an input/output (IO) circuit.

In addition, each of the differential receivers 20 and 22 is coupled to a precision resistor divider, typically external to the respective chips 10 and 12, which provides a precision reference voltage for the receivers. The voltage reference sources 30 and 32, as noted, are each typically made out of two external precision resistors that are mounted on printed circuit board or other substrate.

Typical "read" data transfer from memory 10 to controller 12 goes as follows: Controller 12 sends a request for "read" data transfer to memory 10; Controller 12 enables termination via termination resistor array 24 on data bus 14 in order to condition incoming data for reliable receiving; Memory 10 sends data via data bus 14 to controller 12; Controller 12's receiver 22 compares the signal level of incoming data with reference voltage VREF; Based on the comparison result, over/under VREF, data 1 or 0 are presented to controller 12. In order to avoid false transfer and misdetection on the receiving side, data are required to be not just over or under the reference voltage, but to be over or under with a specified margin level.

With the DDR2 configuration there is an option of an off-chip driver calibration technique that allows a memory controller 12 to check the level of a signal driven by memory 10 and to tell the memory chip 10 to adjust its transmitter 16, change driver strength and consequently change the signal level. Memory transmitter 16 has its driver strength programmable in a number of steps, typically sixteen steps. The driver strength of memory controller transmitter 18 is usually adjusted by the memory controller's own impedance controller, typically in sixteen steps. The usual way to calibrate the memory driver 16 by the memory controller using 12 the Off-Chip Driver calibration mechanism is to first calibrate the memory controller's own driver 18 to a required impedance using the memory controller's own impedance calibration circuit and external reference resistor and then match the memory driver 16 by turning on both the memory driver 16 and the controller driver 18 at the same time driving opposite signal values on bi-directional data bus 14 and comparing resulting signal levels with the reference voltage 30 by the controller's own receiver 22, and accordingly instruct memory via command bus 40 to increase or decrease the transmitter 16 driver strength.

However, this method does not do calibration at nominal operating conditions when termination 24 is turned on and non-active transmitter 18 is turned off. In addition, this method does not provide information about level margins about the reference voltage. So, for this kind of calibration to work reliably, to provide the necessary margin levels for reliable data transfer, it is necessary to know and account for transmitters strength curves (voltage-current), both for memory transmitter 16 being calibrated and controller transmitter 18 used as the reference. As such, calibration done with the fixed VREF reference voltage provided by the precision resistors that are off-chip, do not allow the detection of how marginal a signal level truly may be. With the described calibration method, relying on transmitter 18 in the receiving side controller 12 to provide the reference for calibrating transmitter 16 on the transmitting side memory 10 can be applied only to the bi-directional bus, bus that has transmitters on both sides.

Therefore, there exists a need to address one or more of the above noted problems.

DETAILED DESCRIPTION OF THE DRAWINGS

The invention will be more readily understood in view of the following description when accompanied by the below figures and wherein like reference numerals represent like elements:

FIG. 3 is one example of a lookup table for a resistor divider network for changing a reference voltage generated by an off-chip resistor divider in accordance with one embodiment of the invention;

DETAILED DESCRIPTION OF THE PREFERRED EMBODIMENT

Briefly, an impedance calibration circuit for an off-chip driver, such as a DDR2 memory driver or any other suitable interface, includes an electronically controllable variable reference voltage circuit that is operatively coupled to a reference voltage, such as an off-chip reference voltage if desired, which varies the reference voltage supplied to a receiver circuit. In one example, the variable reference voltage circuit includes reference voltage control logic and an array of switchable resistor elements consisting of pull-up and pull-down resistor elements that may each be selectively switched on or off to change the reference voltage (VREF) generated by external resistor divider being supplied to, for example, an on-chip receiver.

A method is also disclosed which includes determining a driver impedance mismatch condition, and varying a reference voltage for a differential receiver circuit by electronically switching at least one of a pull-up resistor element and a pull-down resistor element to vary a reference voltage received by the differential receiver circuit from an external resistor divider. Among other advantages, the circuit and method allows a determination of how much margin there may be before a receiver threshold level is reached. The circuit and method can allow a determination as to whether a driver signal is below a threshold voltage level. In addition, real operating conditions can be used to see how the drivers are actually driving. In addition, if the VREF level is not symmetrical with respect to a receiver, the electronically controllable variable reference voltage circuit can allow a change in the voltage reference level so that a receiver that receives a signal sent by a corresponding transmitter on the other side of the bus can effect an improved transmission level even though the transmitter may not be adjustable, such as in a PCI bus arrangement. As such, the reference voltage can be varied on-chip in a wide range to make an off-chip driver calibration more effective. In addition, this calibration method is bus type independent, it applies both to unidirectional and bi-directional buses. Other advantages will also be recognized by those of ordinary skill in the art.

Figure 1:
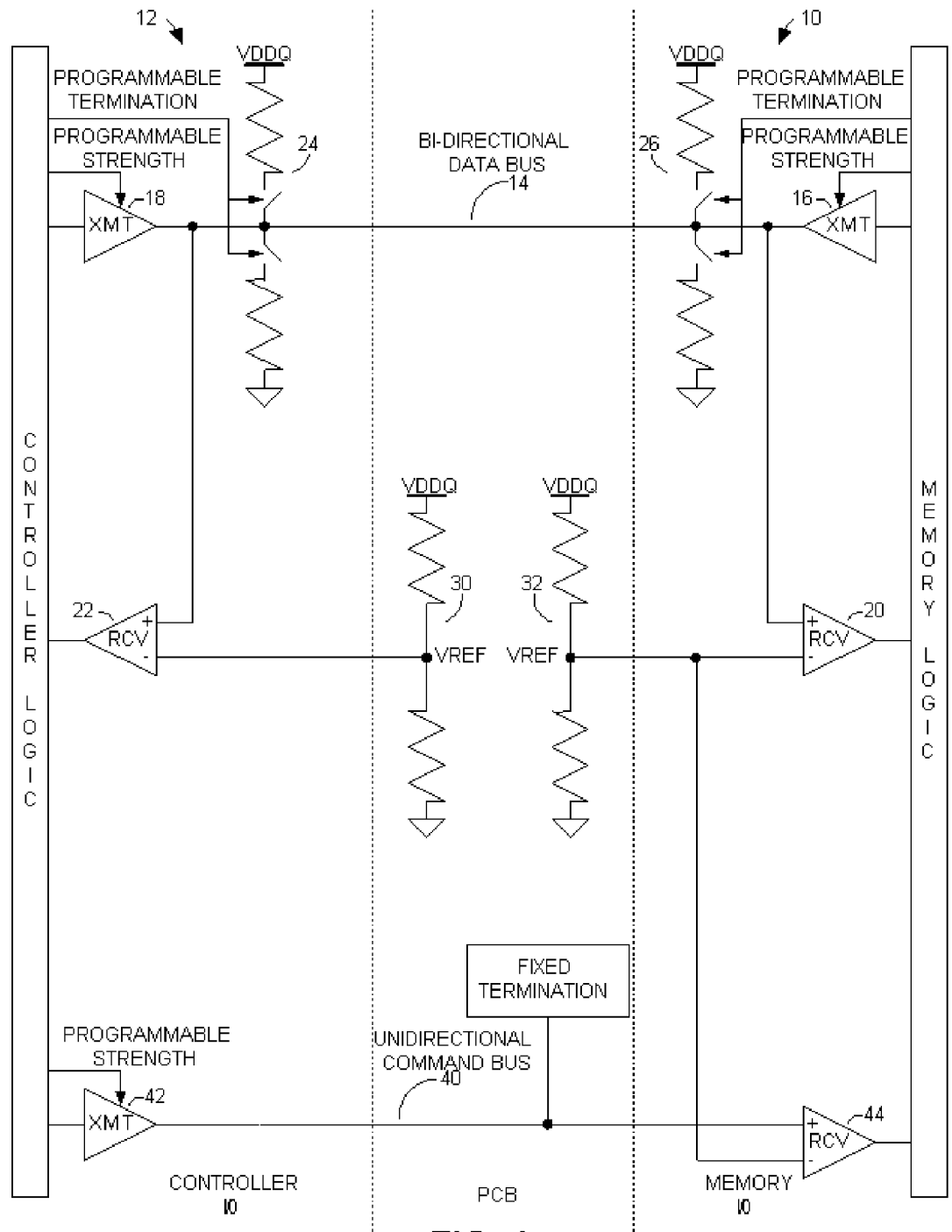
FIG. 1 is a diagram illustrating a prior art configuration of a typical DDR2 interface, consisting of a bi-directional data bus, unidirectional command bus, and supporting off-chip driver calibration.
Figure 2:
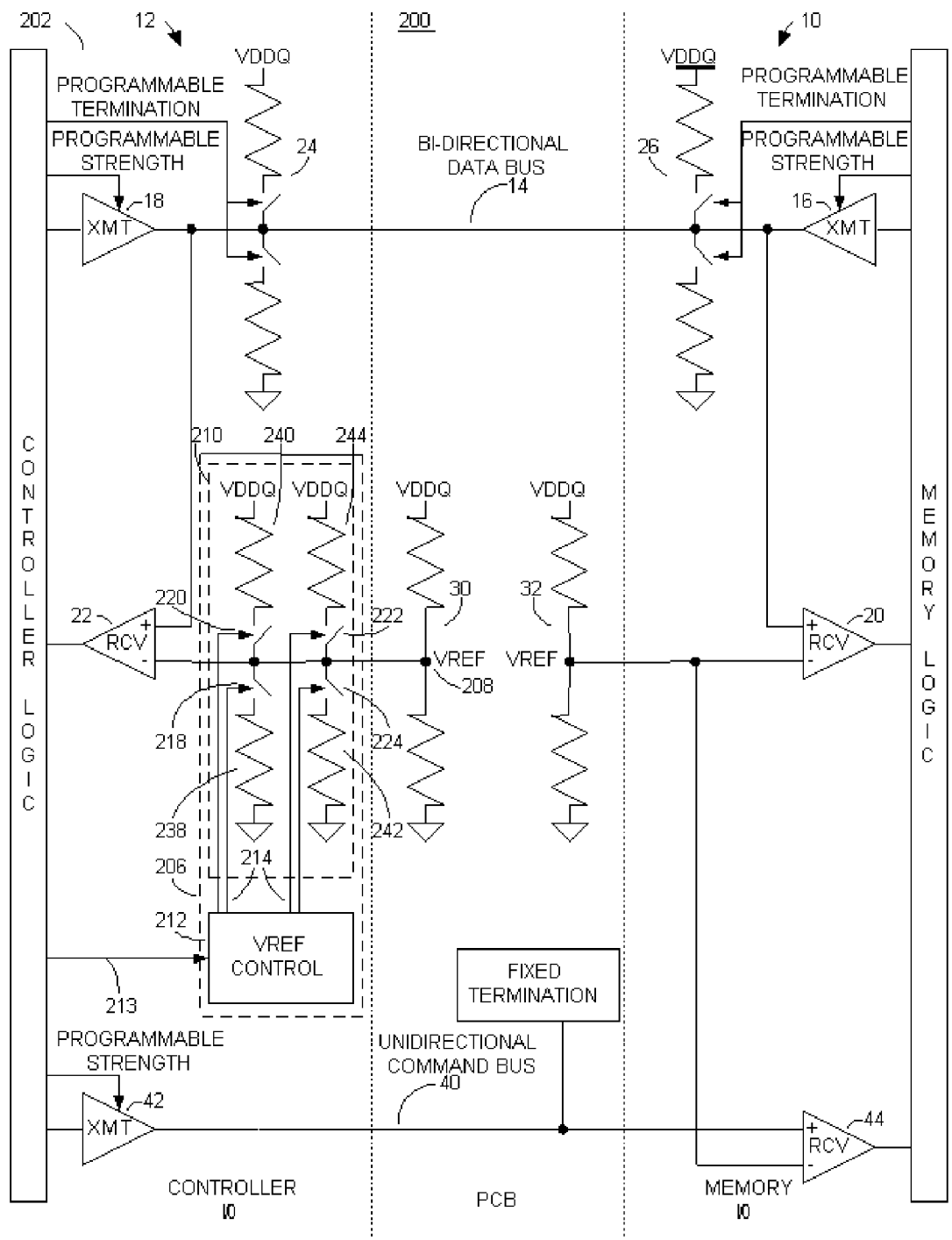
FIG. 2 is a diagram illustrating one example of a voltage reference adjustment circuit for impedance calibration of an off-chip driver or VREF margining and optimization in accordance with one embodiment of the invention.

FIG. 2 illustrates one example of a system 200 that employs a bi-directional data bus 14 to transfer data between, in this example an integrated memory 10 and another integrated circuit 202, such as a memory controller portion of a graphics co-processor or any other suitable circuit. In this particular example, and for purposes of illustration only, the integrated circuit 202 will be a portion of a memory controller in a graphics co-processor. However, it will be recognized that the circuit 202 may be employed in any suitable integrated circuit as desired. The integrated circuit 202 includes an off-chip driver impedance calibration circuit, that in this example, includes control logic inside the memory controller, and a receiver circuit 22 that is coupled to an electronically controllable variable reference voltage circuit 206. The controllable variable reference voltage circuit 206 in this example is shown to be an on-chip electronically controllable variable reference voltage circuit by way of example only. The electronically controllable variable reference voltage circuit 206 is also coupled to a reference voltage source defined by the external resistor divider 30. As shown in this example, the off-chip voltage divider 30 produces a reference voltage 208. The electronically controllable variable reference voltage circuit 206 is operative to vary the reference voltage 208 depending upon the controlling of an array of switchable resistor elements 210. As used herein, "resistor elements" includes any passive elements or active circuits, including but not limited to resistors, operational amplifiers, DACs (Digital to Analog Converters), or any suitable combination thereof (e.g. configuration with power supply for generating VREF connected to DAC reference voltage input). The electronically controllable variable reference voltage circuit 206 also includes in this example reference voltage control logic 212 which is operatively coupled to the controller logic and which converts control information 213 from controller logic to VREF control information 214 suitable for particular implementation of controlling VREF, in this case which controls the array of switchable resistor elements 210. Control information 213 for setting, increasing/decreasing the reference voltage is generated based on the output signal from receiver 22 which compares the level of the reference voltage VREF 208 and the level of the signal from the driver 16 being calibrated. Depending on the signal from the receiver 22 showing the reference voltage VREF 208 being over/under the signal from driver being calibrated 16, the logic and operations described below (flow charts "driver strength calibration" of FIG. 4 (associated waveforms FIGS. 5 & 6), "reference voltage margining" of FIG. 7 (associated waveforms FIGS. 8 & 9) and voltage reference control 212) set, increases/decreases VREF 208 accordingly, achieving closed-loop control. In this example, the control information 214 are signals which control respective switches 218, 220, 222 and 224 of corresponding switchable resistor elements 238, 240, 242, 244. However, any suitable control logic may be used. The array of switchable resistor elements 210 includes switchable pull-up resistor element 240 and a switchable pull-down resistor element 238. In this particular example, a second set of switchable resistor elements is also employed and includes another switchable pull-up resistor element 244 and another switchable resistor pull-down element 242.

As shown, the receiver circuit 22 has an input coupled to receive the reference voltage 208 generated in part by the off-chip resistor divider 30 generated, which is varied by the switching on or off of respective on-chip pull-up and pull-down resistor elements. Another input of the differential receiver circuit 22 is coupled to the transmitter 16 of the memory as known in the art. Also shown is control information which is generated by the memory controller and sent to memory 10 via command bus 40 to command memory 10 to enter an off-chip calibration mode, change driver strength, drive high or low, or any OCD command required for calibration execution.

As part of or separate from the reference voltage control logic 212, may also be included memory that stores a look-up table, for example, or other data that represent different levels of reference voltage 208 associated with various selection combinations of the switchable pull-up and pull-down resistor elements in the array 210.

FIG. 3 is look-up table for switchable resistor configuration for setting, and the adjusting reference voltage 208. A nominal reference voltage, provided by the external resistor divider circuit consisting of two equal resistors, is set to be at 50% of VDD. The internal resistor network in the example consists of resistors equal to or half value of external resistors. By switching on and off the internal resistors, the reference voltage is adjusted and set to a new value that is required for calibration or optimization. As shown in FIG. 3, to keep the reference voltage 208 as is supplied by the external reference voltage circuit, all internal resistors should be switched off (configuration 1, VREF 50%). To set the reference voltage 208 for high level optimization, for example at 75%, internal resistors are switched for configuration 9. To set the reference voltage for low level optimization, for example at 25%, internal resistors are switched for configuration 3. Using the internal resistor network, the reference voltage 208 can be adjusted, as shown in the table, to be at: 20%, 25%, 33%, 38%, 43%, 44%, 50%, 56%, 57%, 62%, 67%, 75%, 80%. Corresponding configurations are: 4, 3, 2, 8, 7, 12, 1, 15, 10, 14, 5, 9, 13. In this method, the precision of adjustment and the number of steps depends on the structure of the internal resistor network including the number, value and precision of its resistors. Different methods can be used to adjust the reference voltage with higher precision and in more steps: for example connecting the voltage used to generate external reference voltage to an 8 bit DAC (Digital to Analog Converter) reference voltage input. There are 256 steps for the whole voltage range, providing 1% adjustment precision.

Figure 4:
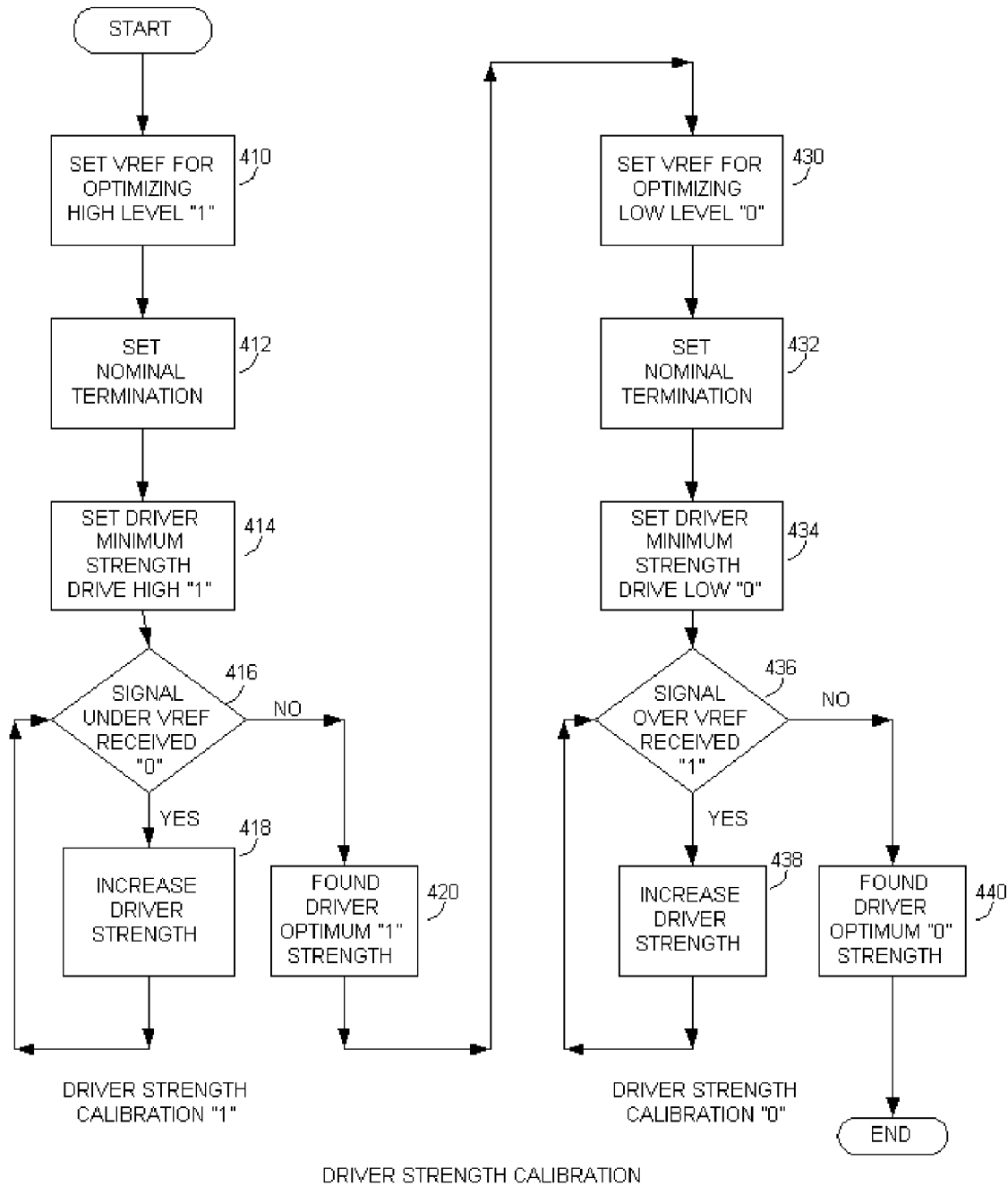
FIG. 4 is a flowchart illustrating one example of a method for providing driver impedance calibration for an off-chip driver in accordance with one embodiment of the invention.
Figure 5:
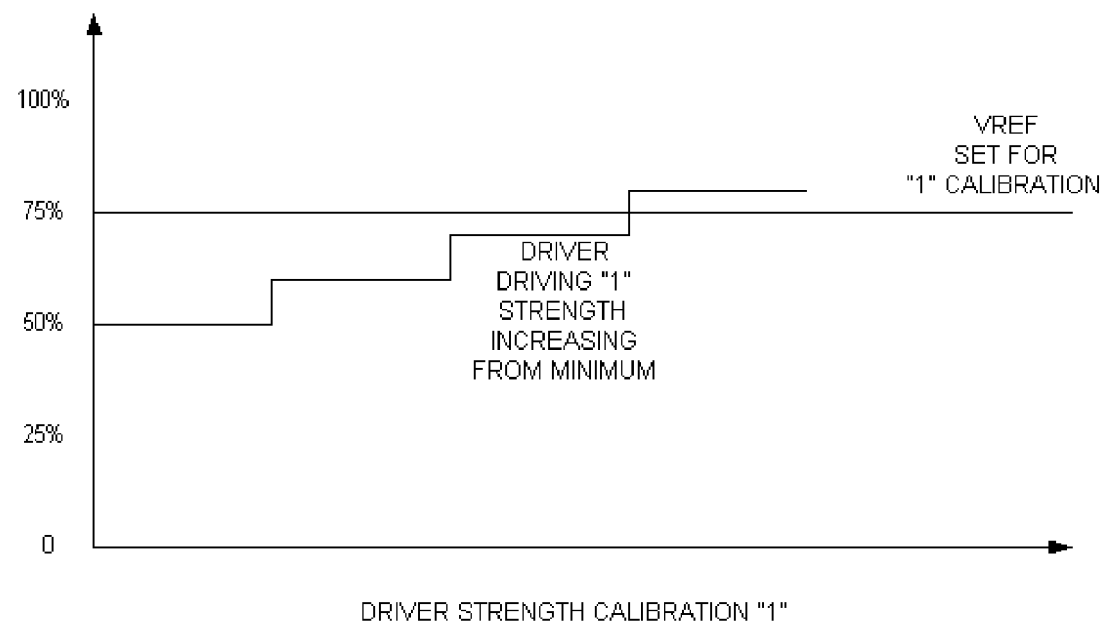
FIG. 5 and FIG. 6 are waveforms illustrating an off-chip driver calibration method.
Figure 6:
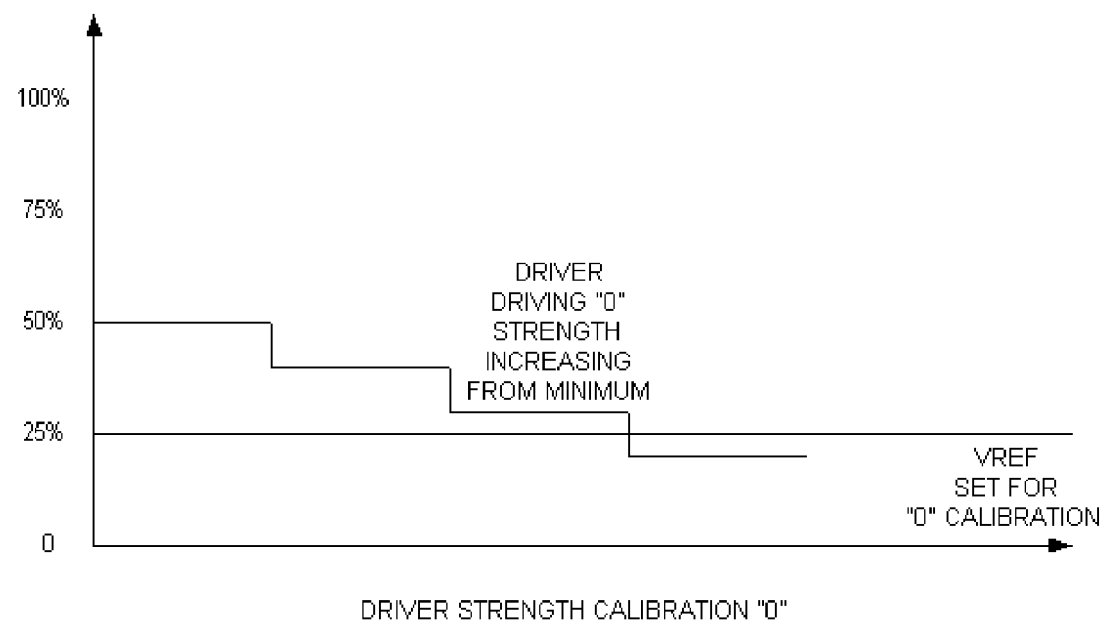

FIG. 4 is flow chart for off-chip driver impedance calibration. FIG. 5 and FIG. 6 are corresponding waveforms. The procedure has two matching parts: high level "1" calibration (FIG. 4, 410-420, and FIG. 5), and low level "0" calibration (FIG. 4, 430-440, and FIG. 6).

As shown, the method may start with high level calibration by setting the reference voltage 208 for optimizing the off-chip driver 16 for high level drive, as shown in block 410. To set the reference voltage for high level optimization, for example at 75%, internal resistors are switched for configuration 9, as shown in the table in FIG. 3. Termination is set to nominal 412, as it would be in operating conditions. The driver 16 is set to drive high level "1" with minimum strength, as shown in block 414. The receiver 22 compares the signal driven by driver 16 to the adjusted reference voltage 208, as shown in block 416. If the signal driven by driver 16 is below the reference voltage, the driver 16 is set to increase its strength via a command on command bus 40 as shown in block 418, and the comparison 416 repeats. If the signal driven by the driver is above the reference voltage, the optimum driver strength for high level "1" is found as shown in block 420.

As shown, the method may continue with low level calibration by setting the reference voltage for optimizing driver for low level drive as shown in block 430. To set the reference voltage 208 for low level optimization, for example at 25%, internal resistors are switched for configuration 3, as shown in the table in FIG. 3. Termination is set to nominal as shown in block 432, as it would be in normal operating conditions. The driver 16 is set to drive low level "0" with minimum strength as shown in block 434. The receiver 22 compares the signal driven by the driver to the adjusted reference voltage as shown in block 436. If the signal driven by driver 16 is above the reference voltage, the driver is set to increase strength as shown in block 438, and the comparison 436 repeats. If the signal driven by the driver 16 is below the reference voltage, optimum driver strength for low level "0" is found as shown in block 440. Drivers that are set to optimum strengths, provide signals symmetrical to the reference voltage with safe margin above/below it, so the interface is optimized for safe data transfer.

Figure 7:
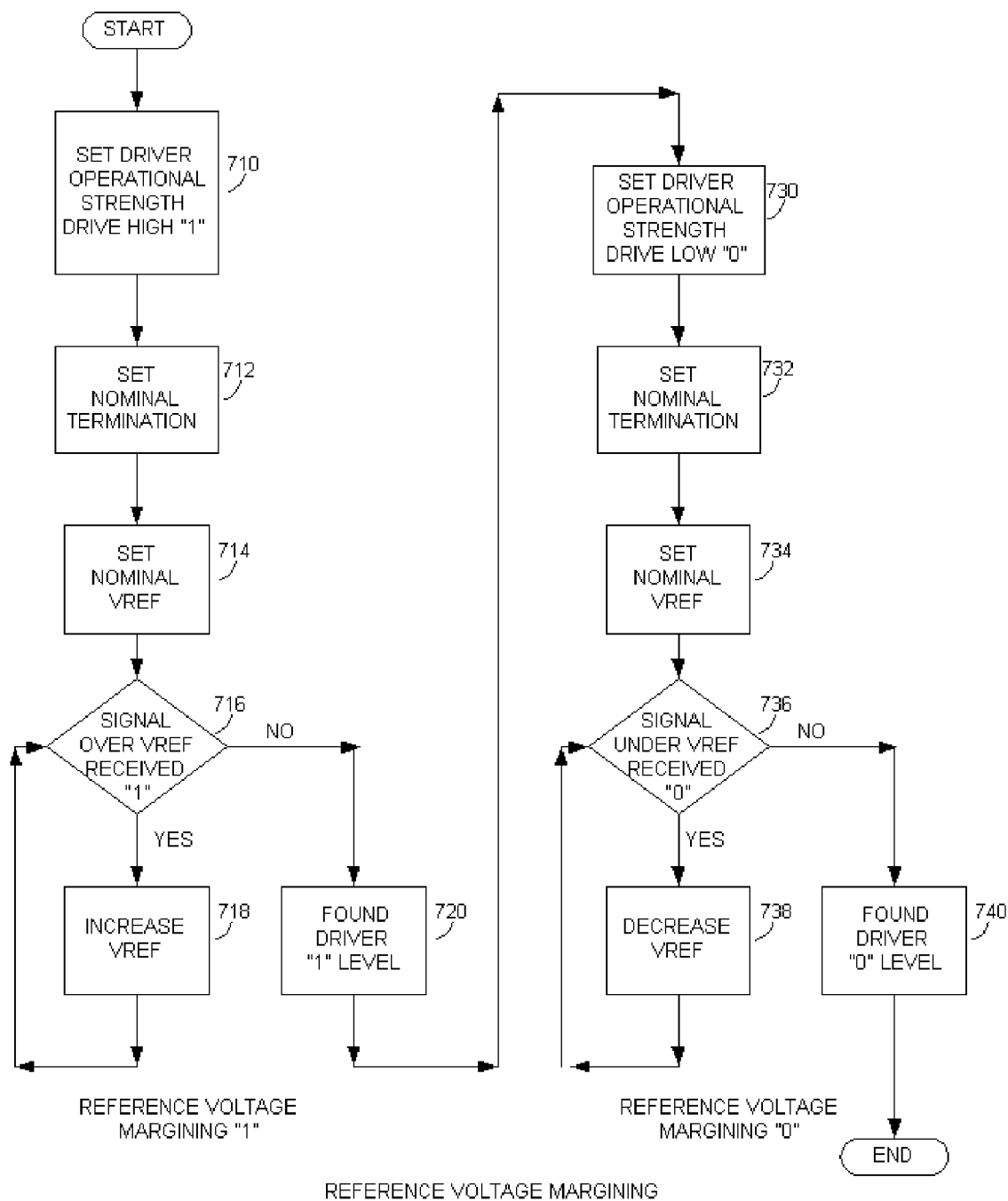
FIG. 7 is a flowchart illustrating one example of a method for margining a reference voltage in accordance with one embodiment of the invention.
Figure 8:
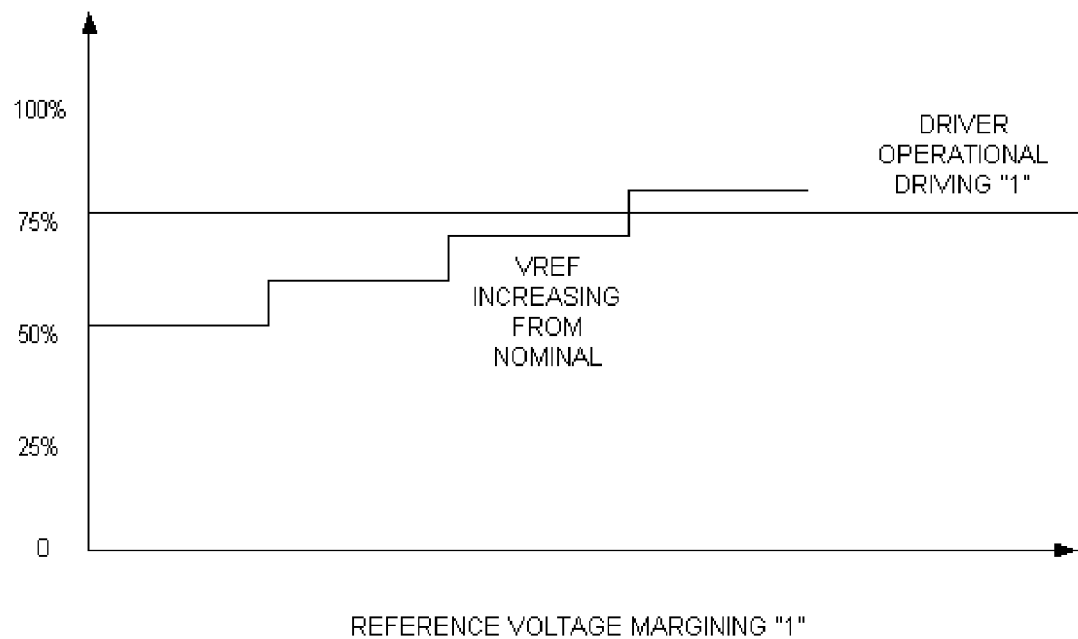
FIG. 8 and FIG. 9 are waveforms illustrating a margining reference voltage method.
Figure 9:
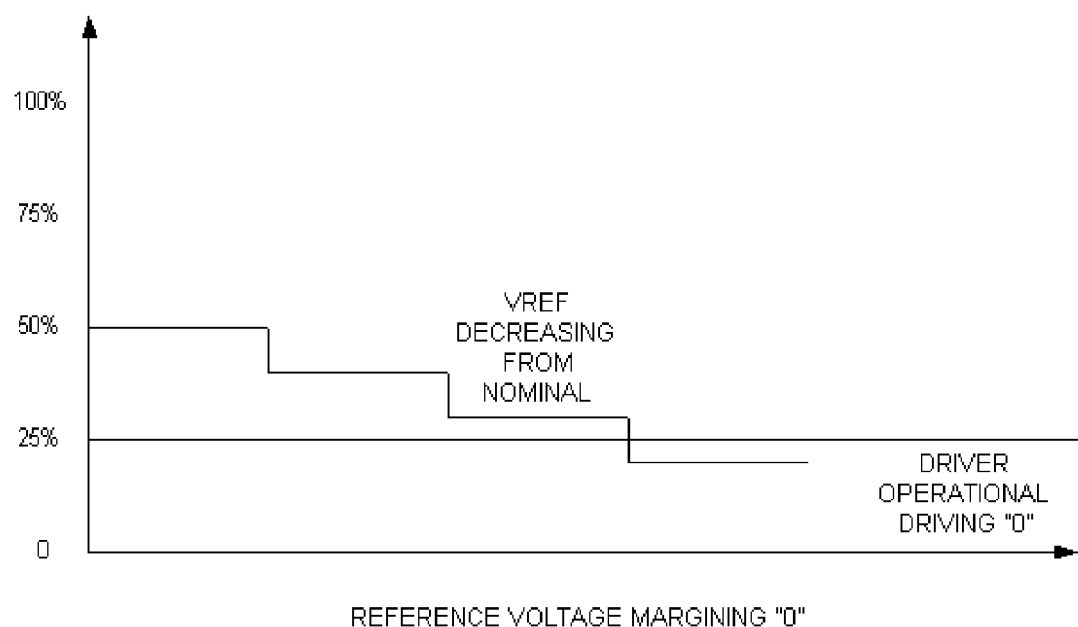

FIG. 7 is flow chart for reference voltage margining. FIG. 8 and FIG. 9 are corresponding waveforms. The procedure has two matching parts: high level "1" margining (FIG. 7, 710-720, and FIG. 8), and low level "0" margining (FIG. 7, 730-740, and FIG. 9).

As shown, the method may start with high level margining by setting the driver to drive high "1" with nominal operational strength 710 (if driver strength is not adjustable, it would be just set to drive). Termination is set to nominal as shown in block 712, as it would be in operating conditions. As shown in block 714, the reference voltage 208 is set to nominal 50%, by setting to internal resistor configuration 1, as in the table in FIG. 3. The receiver 22 compares the signal driven by the driver to the adjusted reference voltage as shown in block 716. If the signal driven by driver is above the set reference voltage, the reference voltage is increased 718, and comparison 716 repeats. The reference voltage is increased by setting different on/off configurations of the internal resistors. From the table in FIG. 3, to increase reference voltage: 50%, 56%, 57%, 62%, 67%, 75%, 80%, configurations are selected in order: 1, 15, 10, 14, 5, 9, 13. If the signal driven by the driver is below the reference voltage, the driver strength for high level "1" is found 720.

As shown, the method may continue with low level margining by setting the driver to drive low "0" with nominal operational strength (block 730) (if driver strength is not adjustable, it would be just set to drive). Termination is set to nominal (block 732), as it would be in operating conditions. The reference voltage is set to nominal 50% (block 734), by setting the internal resistor configuration 1, as in the table in FIG. 3. The receiver compares (block 736) the signal driven by the driver to the adjusted reference voltage. If the signal driven by the driver is below the reference voltage, the reference voltage is decreased (block 738), and comparison (block 736) repeats. The reference voltage is increased by setting different on/off configurations of internal resistors. From the table in FIG. 3, to decrease the reference voltage: 50%, 44%, 43%, 38%, 25%, 20%, configurations are selected in order: 1, 12, 7, 8, 2, 3, 4. If the signal driven by driver is above the reference voltage, driver strength for low level "0" is found 740.

If high/low levels are symmetrical, the nominal reference voltage is already at the optimum level. However, if high/low levels are not symmetrical, the reference voltage should be adjusted so signal levels become symmetrical, getting optimized margins. The reference voltage adjustment, optimization is done by the same circuit.

Figure 10:
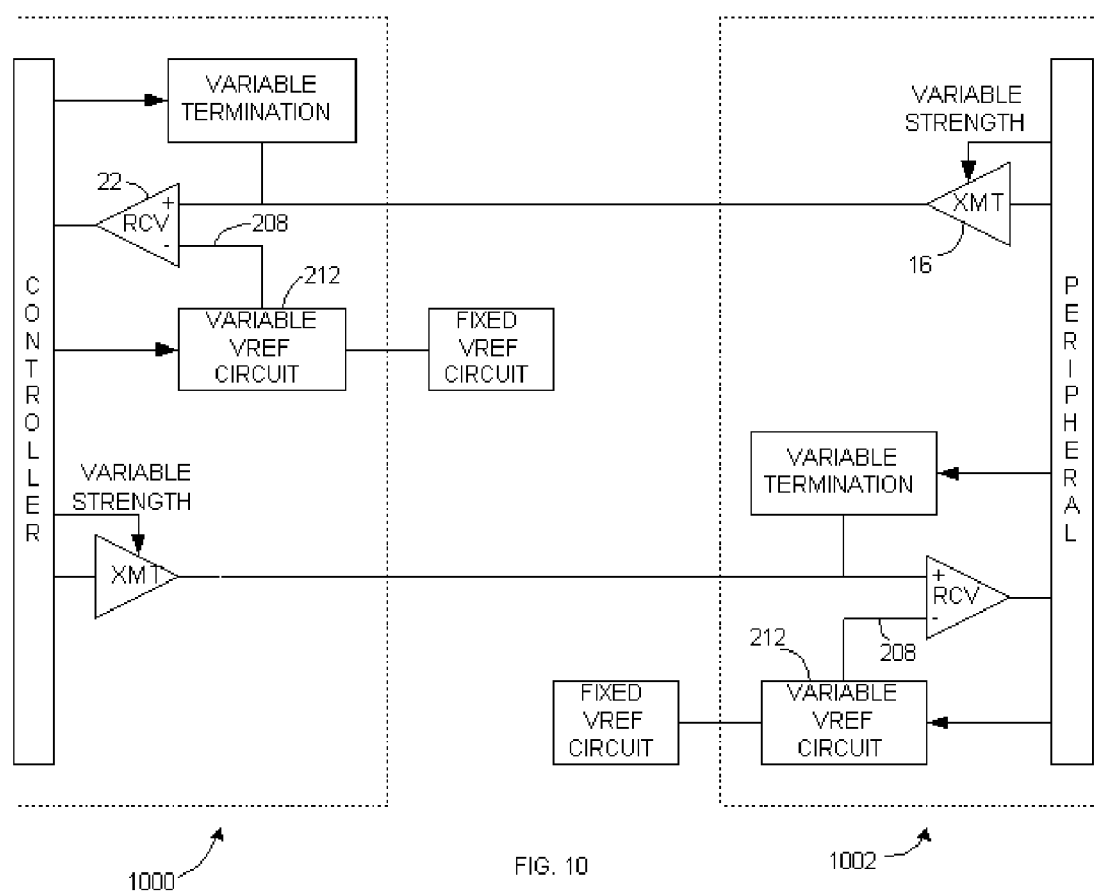
FIG. 10 is a diagram illustrating one example of an integrated memory circuit in accordance with one embodiment of the invention.

FIG. 10 illustrates one example of an integrated circuit 100 that contains appropriate control logic as described and an integrated circuit 1002 containing an interface consisting of differential receiver, controllable termination, variable reference voltage circuit and programmable driver strength transmitter. For example, the integrated circuit 1000 may be graphics controller, micro-controller, processor, connected to a peripheral 1002 like memory or other controller on a suitable interface (PCI, AGP, PCIE, HyperTransport). In this example, both integrated circuits contain variable closed loop controlled reference voltage circuits to optimize signaling for reliable communication, data transfer. A master circuit (in this case controller), instructs slave circuit (in this case peripheral) to execute necessary operations for calibration: drive high, drive low, increase strength, decrees strength, save settings, and so on. Based on received signals and adjusted reference voltage levels, calibration procedure leads to optimal settings for off-chip drivers and on-chip receivers. The procedure can include both controller (master) and peripheral (slave) calibration. On-chip driver calibration can be done in the same way, by having the on-chip driver connected to the on-chip receiver (standard bi-directional bus configuration). It will be recognized that the two integrated circuits 1000 and 1002 may be integrated into one integrated circuit as well, if desired.

The above detailed description of the invention and the examples described therein have been presented for the purpose of illustration and description only and not by limitation. It is therefore contemplated that the present invention cover any and all modifications, variations or equivalents that fall within the spirit and scope of the basic underlying principles disclosed above and claimed herein.

What is claimed is:

1. A method for off-chip driver impedance calibration comprising:
   calibrating a logical high drive level for an off-chip driver by controlling an electrically controllable variable reference voltage circuit through a first setting;
   setting termination resistors effecting the off-chip driver to a level;
   controlling the off-chip driver to drive at a logical high level;
   comparing, by an on-chip receiver that has an input operatively coupled to receive a variable reference voltage and another input operatively coupled to an output of the off chip driver, the reference voltage to the output of the off chip driver; and
   adjusting the reference voltage electronically until a receiver detects a logical high being provided by the off chip driver.

2. The method of claim 1 comprising:
   controlling the reference voltage to a lower level reference voltage;
   commanding the off chip driver to drive at a logical low level;
   comparing, by the receiver, the output logical low voltage to the reference voltage; and
   notifying the driver to increase its drive strength until the receiver detects that the drive signal in the logical low level is below the reference voltage.

3. A method for providing reference voltage margin adjustment comprising:
   setting an off-chip driver to drive a logical high;
   setting a variable reference voltage that is operatively coupled to an input of an on-chip receiver to a nominal setting by disabling variable resistor element array;
   setting a termination level of the off-chip driver to a nominal setting and also controlling the off-chip driver to drive a logical high with nominal operational strength; and
   comparing the output of the off chip driver with the initial nominal setting of the reference voltage and adjusting and activating a variable resistor array to adjust the reference voltage to a setting that allows the receiver to detect a logical while the off-chip driver is set at a nominal output level.

4. Circuitry comprising:
   an electrically controllable variable reference voltage circuit operative to calibrate a logical high drive level for an off-chip driver through a first setting;
   circuitry operative to set termination resistors effecting the off-chip driver to a level;
   circuitry operative to control the off-chip driver to drive at a logical high level;
   an on-chip receiver that has an input operatively coupled to receive a variable reference voltage and another input operatively coupled to an output of the off-chip driver, operative to compare the reference voltage to the output of the off-chip driver; and
   circuitry operative to adjust the reference voltage electronically until a receiver detects a logical high being provided by the off-chip driver.

5. The circuitry of claim 4 comprising circuitry operative to:
   control the reference voltage to a lower level reference voltage;
   command the off-chip driver to drive at a logical low level;
   and the receiver operative to compare the output logical low voltage to the reference voltage; and
   circuitry operative to notify the driver to increase its drive strength until the receiver detects that the drive signal in the logical low level is below the reference voltage.

6. Circuitry comprising:
   circuitry operative to set an off-chip driver to drive a logical high;
   circuitry operative to set a variable reference voltage that is operatively coupled to an input of an on-chip receiver to a nominal setting by disabling variable resistor element array;
   circuitry operative to set a termination level of the off-chip driver to a nominal setting and also control the off-chip driver to drive a logical high with nominal operational strength; and
   circuitry operative to compare the output of the off-chip driver with the initial nominal setting of the reference voltage and adjust and activate a variable resistor array to adjust the reference voltage to a setting that allows the receiver to detect a logical while the off-chip driver is set at a nominal output level.

* * * * *